United States Patent
Ueoka et al.

(10) Patent No.: US 12,439,742 B2
(45) Date of Patent: Oct. 7, 2025

(54) LIGHT EMITTING DEVICE WITH ELECTRODE HAVING SPECIFIED MOLAR RATIO OF MAGNESIUM TO ZINC

(71) Applicants: IDEMITSU KOSAN CO., LTD., Chiyoda-ku (JP); NATIONAL UNIVERSITY CORPORATION TOKAI NATIONAL HIGHER EDUCATION AND RESEARCH SYSTEM, Nagoya (JP); NIKKISO CO., LTD., Shibuya-ku (JP)

(72) Inventors: Yoshihiro Ueoka, Sodegaura (JP); Shigekazu Tomai, Sodegaura (JP); Satoshi Katsumata, Sodegaura (JP); Maki Kushimoto, Nagoya (JP); Manato Deki, Nagoya (JP); Yoshio Honda, Nagoya (JP); Hiroshi Amano, Nagoya (JP)

(73) Assignees: IDEMITSU KOSAN CO., LTD., Chiyoda-ku (JP); NATIONAL UNIVERSITY CORPORATION TOKAI NATIONAL HIGHER EDUCATION AND RESEARCH SYSTEM, Nagoya (JP)

(*) Notice: Subject to any disclaimer, the term of this patent is extended or adjusted under 35 U.S.C. 154(b) by 1061 days.

(21) Appl. No.: 17/280,045

(22) PCT Filed: Sep. 26, 2019

(86) PCT No.: PCT/JP2019/037751
§ 371 (c)(1),
(2) Date: Mar. 25, 2021

(87) PCT Pub. No.: WO2020/067235
PCT Pub. Date: Apr. 2, 2020

(65) Prior Publication Data
US 2022/0037561 A1 Feb. 3, 2022

(30) Foreign Application Priority Data

Sep. 26, 2018 (JP) ................................ 2018-180754
Mar. 8, 2019 (JP) ................................ 2019-042338

(51) Int. Cl.
H10H 20/833 (2025.01)
C23C 14/08 (2006.01)
(Continued)

(52) U.S. Cl.
CPC ......... H10H 20/833 (2025.01); C23C 14/082 (2013.01); C23C 14/34 (2013.01);
(Continued)

(58) Field of Classification Search
CPC . H01L 33/32; H01L 33/62; H01L 2933/0016; H01L 2933/0066; H01L 33/42;
(Continued)

(56) References Cited

U.S. PATENT DOCUMENTS

| 5,622,653 A | 4/1997 | Orita et al. |
| 2004/0089874 A1 | 5/2004 | Negami et al. |

(Continued)

FOREIGN PATENT DOCUMENTS

| EP | 2 869 335 A1 | 5/2015 |
| JP | 8-245220 A | 9/1996 |

(Continued)

OTHER PUBLICATIONS

Wei Yang, Wide Bandgap MgxZn1—xO Semiconducting Thin Films and Applications to Solar Visible Blind Ultraviolet Photodetectors, 2002, Dissertation University of Maryland, UMI No. 3080284 (Year: 2002).*

(Continued)

*Primary Examiner* — Yara B Green
*Assistant Examiner* — Christopher M Roland
(74) *Attorney, Agent, or Firm* — Oblon, McClelland, Maier & Neustadt, L.L.P.

(57) ABSTRACT

A stacked body comprising: a semiconductor layer comprising a group III-V nitride semiconductor, and an electrode layer, wherein the electrode layer comprises magnesium oxide and zinc oxide, wherein the molar ratio of magnesium based on the sum of magnesium and zinc of the electrode layer [Mg/(Mg+Zn)] is 0.25 or more and 0.75 or less, and conductivity of the electrode layer is $1.0 \times 10^{-2}$ S/cm or more.

19 Claims, 5 Drawing Sheets

(51) Int. Cl.
*C23C 14/34* (2006.01)
*H10H 20/01* (2025.01)
*H10H 20/825* (2025.01)
*H10H 20/857* (2025.01)

(52) U.S. Cl.
CPC ........... *H10H 20/01* (2025.01); *H10H 20/032* (2025.01); *H10H 20/0364* (2025.01); *H10H 20/825* (2025.01); *H10H 20/857* (2025.01)

(58) Field of Classification Search
CPC .. H01L 33/0095; H10H 20/01; H10H 20/032; H10H 20/0364; H10H 20/825; H10H 20/83; H10H 20/832; H10H 20/833; H10H 20/857; C23C 14/082; C23C 14/34
See application file for complete search history.

(56) References Cited

U.S. PATENT DOCUMENTS

| | | | |
|---|---|---|---|
| 2008/0210957 | A1 | 9/2008 | Watanabe et al. |
| 2009/0101493 | A1 | 4/2009 | Nakayama et al. |
| 2009/0267048 | A1 | 10/2009 | Nakahara |
| 2012/0104432 | A1* | 5/2012 | Shim ................. H01L 33/42 257/E33.064 |
| 2012/0213242 | A1 | 8/2012 | Tanaka et al. |
| 2013/0146916 | A1 | 6/2013 | Yamamoto et al. |
| 2013/0177762 | A1 | 7/2013 | Nakayama et al. |
| 2013/0248780 | A1 | 9/2013 | Zhou et al. |
| 2014/0326319 | A1 | 11/2014 | Kim et al. |
| 2015/0171257 | A1 | 6/2015 | Maekawa et al. |
| 2022/0393073 | A1* | 12/2022 | Tomai ................. H01L 33/42 |

FOREIGN PATENT DOCUMENTS

| | | | |
|---|---|---|---|
| JP | 2005-209734 | A | 8/2005 |
| JP | 2005340370 | A * | 12/2005 |
| JP | 2007-19488 | A | 1/2007 |
| JP | 2010-53454 | A | 3/2010 |
| JP | 2013-120829 | A | 6/2013 |
| JP | 2014-500403 | A | 1/2014 |
| JP | 2014-129230 | A | 7/2014 |
| TW | 200739958 | | 10/2007 |
| TW | 201337014 | A * | 9/2013 |
| TW | I535875 | B * | 6/2016 |
| WO | WO 2009/072365 | A1 | 6/2009 |

OTHER PUBLICATIONS

Hwang, J.D. et al. "Annealing effects on MgZnO films and applications in Schottky-barrier photodetectors." J. Phys. D: Appl. Phys. 48 (2015) 405103 (6pp). (Year: 2015).*

Kim, Y.Y. et al. "High-temperature growth and in-situ annealing of MgZnO thin films by RF sputtering." Thin Solid Films 516 (2008) 5602-5606. (Year: 2007).*

Harada, C. et al. "Phase separation in Ga-doped MgZnO layers grown by plasma-assisted molecular-beam epitaxy." Materials Science in Semiconductor Processing 6 (2003) 539-541. (Year: 2003).*

Kushimoto, M. et al. "Effect of Annealing on the Electrical and Optical Properties of MgZnO Films Deposited by Radio Frequency Magnetron Sputtering." Phys. Status Solidi A 2020, 217, 1900955. (Year: 2020).*

Liang, J. et al. "Annealing effect on electrical properties of high-k MgZnO film on silicon." Semicond. Sci. Technol. 20 (2005) L15-L19. (Year: 2005).*

Combined Chinese Office Action and Search Report issued Jan. 4, 2023 in Chinese Patent Application No. 201980063611.1, 8 pages.

Extended European Search Report issued May 30, 2022 in European Patent Application No. 19864036.9, 9 pages.

Japanese Office Action issued Apr. 11, 2023 in Japanese Application 2020-549323, (with computer-generated English translation), 9 pages.

International Search Report issued Dec. 17, 2019 in PCT/JP2019/037751 filed Sep. 26, 2019, 2 pages.

International Preliminary Report on Patentability and Written Opinion issued Apr. 8, 2021 in PCT/JP2019/037751 (submitting English translation only), 6 pages.

Combined Taiwanese Office Action and Search Report issued Apr. 27, 2023 in Patent Application No. 108134878 (with English translation of Category of Cited Documents), 8 pages.

Office Action issued Jun. 4, 2024, in corresponding Korean Patent Application No. 10-2021-7008391, 5 pages.

* cited by examiner (a)                          (b)

(a)                          (b)

(a)

(b)

Magnification: 500,000 times

LIGHT EMITTING DEVICE WITH ELECTRODE HAVING SPECIFIED MOLAR RATIO OF MAGNESIUM TO ZINC

TECHNICAL FIELD

The invention relates to an oxide stacked body having an electrode layer that transmits ultraviolet rays and a method for producing the same.

BACKGROUND ART

Deep-ultraviolet light-emitting semiconductor devices such as deep-ultraviolet light-emitting diodes and deep-ultraviolet laser diodes using nitride semiconductors such as gallium nitride have attracted attention as lightweight and long-life deep-ultraviolet light sources. The deep-ultraviolet light source can be applied to various fields such as pasteurization, sensing, and industrial applications. Since a mercury lamp which is a conventional deep-ultraviolet light source has an environmental problem of mercury, a deep-ultraviolet light-emitting semiconductor device is expected as an alternative.

For visible light-emitting diodes, tin-doped indium oxide (ITO), a transparent conductive material, is widely used as an electrode of p-type nitride diodes.

The transparency of the transparent conductive material is related to the band-edge absorption wavelength (absorption edge wavelength). The band-edge absorption wavelength refers to the wavelength at which the light absorption begins due to electron transition from the valence band to the conduction band of the material. The band-edge absorption wavelength can be measured by a reflection method or a transmission method using a spectrophotometer. Since the band-edge absorption wavelength of ITO is in the vicinity of 450 nm, ITO does not absorb light on the longer wavelength side. This means that ITO has transparency over almost the entire region except for the short-wavelength region in the visible region. In fact, in a semiconductor device using ITO, light loss due to light absorption is small in the visible light region. In addition, ITO has a carrier concentration comparable to that of metal, relatively high carrier mobility as oxides, and high conductivity (electrical conductivity) of 100 S/cm or more. Therefore, ITO is widely used for the transparent electrode of the diode which emits visible light.

On the other hand, as the electrode of the ultraviolet light-emitting semiconductor device, it is desirable to have transparency in the ultraviolet region. ITO, which is widely used at present, absorbs light of a short wavelength (wavelength of 400 nm or less). Therefore, ultraviolet rays generated in the emitting layer are absorbed by ITO, which causes a decrease in the luminous efficiency of the device. In addition, materials where the band-edge absorption wavelength is short, for example, $SiO_2$ transmit ultraviolet light of 400 nm or less but are insulators and unsuitable as electrodes.

Therefore, a novel electrode having high light transmittance in a wavelength region shorter than 400 nm, and good conductivity has been required.

In order to cope with the above-mentioned problems, for example, in Patent Document 1, a plurality of indium oxides is reported as a material having a band-edge absorption wavelength shorter than 450 nm. However, each of the oxides has a band-edge absorption wavelength of 340 nm or more, which is insufficient as an electrode of an ultraviolet light-emitting semiconductor device.

In Patent Document 2, zinc oxide containing magnesium is reported as a material having a band-edge absorption wavelength shorter than 450 nm. The absorption edge wavelength of zinc oxide magnesium is at 350 nm. However, since conductivity is as low as about 0.02 µS/cm, it is insufficient as an electrode.

RELATED ART DOCUMENT

Patent Document

[Patent Document 1] JP H8-245220 A
[Patent Document 2] JP 2014-129230 A

SUMMARY OF THE INVENTION

It is an object of the invention to provide a stacked body of an electrode-nitride semiconductor which is transparent in the ultraviolet region, e.g., in the region of wavelengths below 400 nm, and which has high conductivity.

According to the invention, the following stacked body and the like are provided.

1. A stacked body comprising:
    a semiconductor layer comprising a group III-V nitride semiconductor, and
    an electrode layer,
    wherein the electrode layer comprises magnesium oxide and zinc oxide,
    wherein the molar ratio of magnesium based on the sum of magnesium and zinc of the electrode layer [Mg/(Mg+Zn)] is 0.25 or more and 0.75 or less, and
    conductivity of the electrode layer is $1.0 \times 10^{-2}$ S/cm or more.
2. The stacked body according to 1, wherein the molar ratio of magnesium based on the sum of magnesium and zinc of the electrode layer [Mg/(Mg+Zn)] is 0.4 or more and 0.75 or less.
3. The stacked body according to 1 or 2, wherein the molar ratio of magnesium based on the sum of magnesium and zinc of the electrode layer [Mg/(Mg+Zn)] is 0.5 or more and 0.75 or less.
4. The stacked body according to any one of 1 to 3, wherein the electrode layer further comprises trivalent or tetravalent element X other than Mg and Zn, and
    the molar ratio of the element X based on total metal elements [element X/total metal elements] is 0.0001 or more and 0.20 or less.
5. The stacked body of 4, wherein the element X is at least one element selected from the group consisting of B, Al, Ga, In, Tl, C, Si, Ge, Sn and Pb.
6. The stacked body according to any one of 1 to 5, wherein in the X-ray diffraction measurement of the electrode layer, a diffraction peak is observed at 2θ=34.8±0.5 deg.
7. The stacked body according to any one of 1 to 6, wherein the electrode layer has a light transmittance of 4% or more at a wavelength of 260 nm.
8. The stacked body according to any one of 1 to 7, wherein the electrode layer is composed of microcrystals and is phase-separated.
9. The stacked body according to any one of 1 to 8, wherein the electrode layer has a columnar crystal growth.
10. The stacked body according to any one of 1 to 9, wherein the particle size of a region mainly of magnesium oxide of the electrode layer is 20 nm or more and 200 nm or less.
11. The stacked body according to any one of 1 to 10, wherein the semiconductor layer comprises AlN, GaN, InN, or a mixed crystal thereof.

12. The stacked body according to any one of 1 to 11, comprising a wiring layer in contact with a part of the electrode layer,
   wherein the wiring layer comprises at least one selected from the group consisting of metals comprising one or more selected from Ni, Pd, Pt, Rh, Zn, In, Sn, Ag, Au, Mo, Ti, Cu and Al, oxides selected from ITO, $SnO_2$, ZnO, $In_2O_3$, $Ga_2O_3$, $RhO_2$, NiO, CoO, PdO, PtO, $CuAlO_2$ and $CuGaO_2$, nitrides selected from TiN, TaN and SiNx, and poly-Si.
13. The stacked body according to any one of 1 to 12, wherein the thickness of the electrode layer is 10 nm or more and 1 µm or less.
14. A semiconductor device, comprising the stacked body according to any one of 1 to 13.
15. A method for producing the stacked body according to any one of 1 to 13,
   wherein the electrode layer comprising magnesium oxide and zinc oxide is formed on the semiconductor layer comprising the group III-V nitride semiconductor.
16. The method of producing according to 15, wherein the electrode layer is heat-treated at a temperature of 750° C. or higher.
17. The method for producing according to 15 or 16, wherein a wiring layer is formed in contact with a part of the electrode layer,
   wherein the wiring layer comprises at least one selected from the group consisting of metals comprising one or more selected from Ni, Pd, Pt, Rh, Zn, In, Sn, Ag, Au, Mo, Ti, Cu and Al, oxides selected from ITO, $SnO_2$, ZnO, $In_2O_3$, $Ga_2O_3$, $RhO_2$, NiO, CoO, PdO, PtO, $CuAlO_2$ and $CuGaO_2$, nitrides selected from TiN, TaN and SiNx, and poly-Si.
18. The method for producing according to any one of 15 to 17, wherein the electrode layer is formed by sputtering using at least one selected from $O_2$, Ar and $N_2$ as a sputtering gas, or ion plating.
19. The method for producing according to 17, wherein the wiring layer is formed by sputtering using at least one selected from $O_2$, Ar and $N_2$ as a sputtering gas, or evaporation.

According to the invention, a stacked body of an electrode-nitride semiconductor that is transparent in the ultraviolet region, and which has high conductivity can be provided.

MODE FOR CARRYING OUT THE INVENTION

The stacked body according to one embodiment of the invention contains a semiconductor layer containing a group III-V nitride semiconductor, and an electrode layer. The electrode layer is formed in contact with a part or the entire surface of the semiconductor layer.

[Semiconductor Layer]

In this embodiment, the semiconductor layer contains a group III-V nitride semiconductor. Examples of the semiconductor include GaN, InGaN, AlGaN, AlInGaN, AlN, InN, and the like. The semiconductor layer is preferably AlN, GaN, InN, or a mixed crystal thereof.

The semiconductor layer may be an n-type semiconductor, also may be a p-type semiconductor. As the n-type dopant, Si or the like can be used. As the p-type dopant, Mg or the like can be used. In addition to Si and Mg, other known dopants can be used.

The semiconductor layer can be formed, for example, by epitaxially growing on the support substrate for forming the semiconductor layer. The support substrate is not particularly limited, as long as the semiconductor layer can be formed, for example, GaN, InGaN, AlGaN, AlN, InN, SiC, Si and sapphire can be suitably used.

The semiconductor layer can also be formed on another material. For example, GaN can be used for the surface in contact with the electrode layer, and Si can be used as the support substrate.

The thickness of the semiconductor layer can be adjusted as appropriate to obtain the desired electrical characteristics. The thickness is preferably in the range of, for example, 10 nm to 2 mm.

Whether the semiconductor layer is a p-type semiconductor or an n-type semiconductor is determined by Hall-effect measurement. When the Hall-effect measurement is difficult due to high resistivity, the content of acceptor elements (Mg, etc.) and donor elements (Si, etc.) is compared by the presence/absence of acceptor-derived peaks (385 to 400 nm) from photoluminescence (PL) or by secondary ion mass spectrometry (SIMS) to determine whether the semiconductor layer is a p-type semiconductor or an n-type semiconductor based on which elements are contained in an order of magnitude greater or more.

[Electrode Layer]

In this embodiment, the electrode layer contains magnesium oxide and zinc oxide, and the molar ratio of magnesium based on the sum of magnesium and zinc of the electrode layer [Mg/(Mg+Zn)] is 0.25 or more and 0.75 or less.

In this embodiment, by mixing magnesium oxide and zinc oxide at a predetermined ratio and controlling the morphology of the electrode layer, an electrode layer having transparency in the ultraviolet region and having high conductivity is obtained.

In the present application, magnesium oxide and zinc oxide may or may not contain a solid-solution of magnesium and zinc (MgZnOx).

Figure 10:
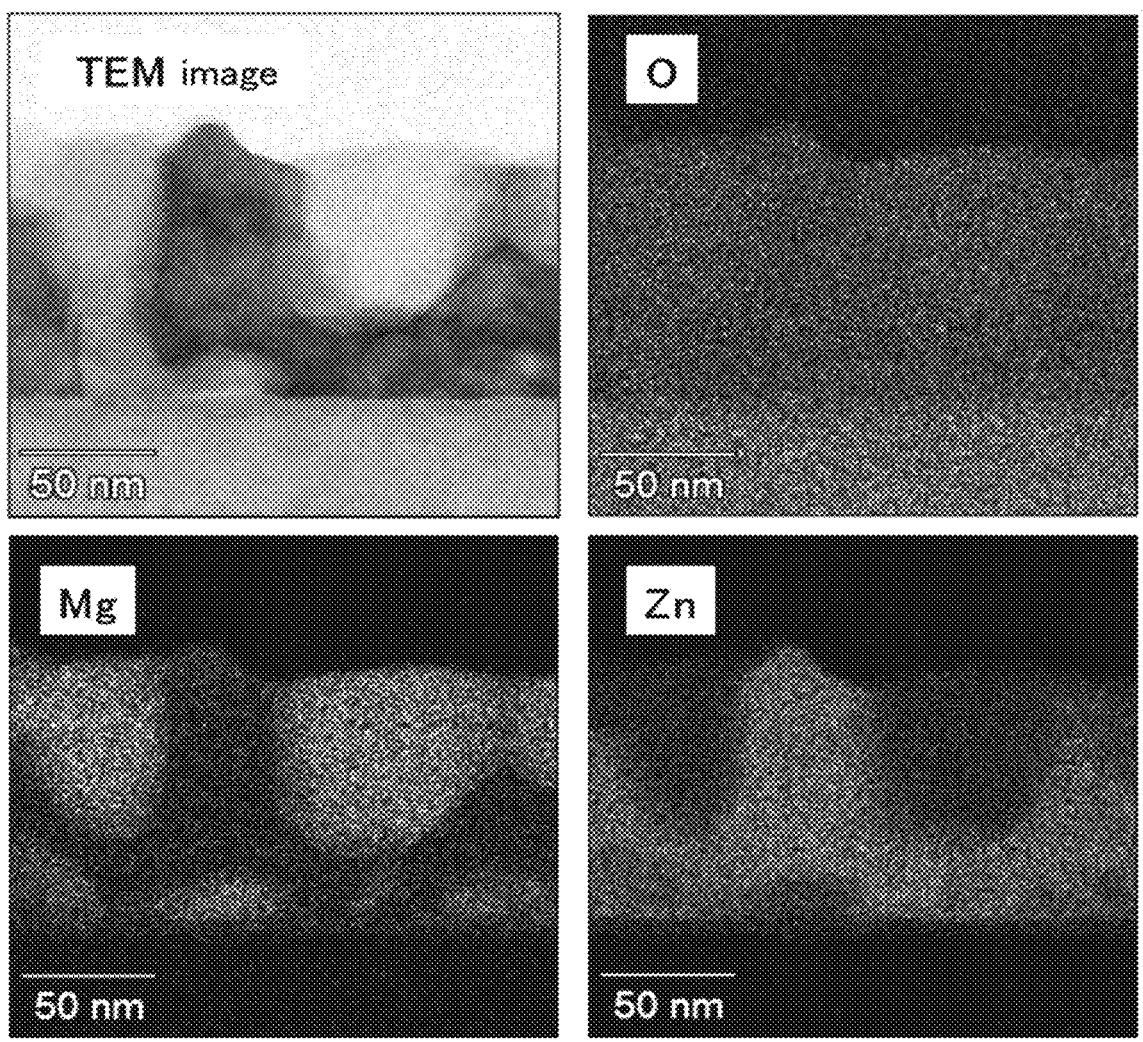
FIG. 10 is a TEM image and an energy dispersive X-ray analysis (EDX) image of the cross-section of the electrode layer of Example 2.

In the electrode layer of this embodiment, regions mainly composed of zinc oxide (ZnO, etc.), which has conductivity but has no ultraviolet transmittance, and regions mainly composed of magnesium oxide (MgO, etc.), which has no conductivity but has ultraviolet transmittance, are dispersed in each other (see FIG. 10, which is TEM and EDX images of the cross-section of the electrode layer). It is presumed that conductivity is carried by regions mainly composed of zinc oxide, and ultraviolet transmittance is carried by a region mainly containing magnesium oxide. As a result, an electrode layer having both conductivity and ultraviolet transmittance is obtained. It is considered that this conduction phenomenon can be explained by the percolation conduction model.

In order to develop conductivity and ultraviolet transmittance, the molar ratio of magnesium based on the sum of magnesium and zinc [Mg/(Mg+Zn)] in the electrode layer is set to 0.25 or more and 0.75 or less.

The molar ratio [Mg/(Mg+Zn)] may be, for example, 0.25 or more, 0.30 or more, 0.33 or more, 0.35 or more, 0.37 or more, 0.40 or more, 0.43 or more, 0.45 or more, 0.47 or more, or 0.5 or more. Further, the molar ratio [Mg/(Mg+Zn)] may be 0.75 or less or 0.70 or less.

In one embodiment, the molar ratio [Mg/(Mg+Zn)] is preferably 0.30 or more and 0.75 or less, 0.33 or more and 0.75 or less, 0.40 or more and 0.75 or less, and is more preferably 0.50 or more and 0.75 or less.

In this embodiment, it is preferable that the electrode layer further contains a trivalent or tetravalent element X other than Mg and Zn. The molar ratio of the element X based on total metal elements is preferably 0.0001 or more and 0.20 or less, more preferably 0.001 or more and 0.10 or less. By containing the element X, the element X is doped in the zinc oxide, and conductivity may be further improved.

Examples of the element X include B, Al, Ga, In, Tl, C, Si, Ge, Sn and Pb. Preferably, the element X is B, Al or Ga.

The composition of the electrode layer can be controlled by, for example, adjusting the composition of a sputtering target when the electrode layer is formed by sputtering. The composition of the electrode layer can also be controlled in co-sputtering with the magnesium oxide (MgOx) sintered target, the zinc oxide (ZnOx) sintered target, and optionally, the sintered target containing element X, by adjusting the deposition rate of each. In another film forming method, the composition of the electrode layer can be controlled by preparing the composition of raw materials such as an evaporation source.

In the case of forming the electrode layer by sputtering or vapor deposition, the composition of the sputtering target and the deposition source and the electrode layer substantially coincide.

The molar ratio of each element of the electrode layer can be measured, for example, by secondary ion mass spectrometry.

In order to obtain a morphology developing conductivity and ultraviolet transmittance, for example, the electrode layer is heat-treated at high temperature after deposition. The electrode layer immediately after film formation is in a state in which zinc oxide and magnesium oxide are uniformly mixed. It is presumed that the heat treatment of the electrode layer in this state causes the aggregation, separating, and the like of oxides, and as a result, zinc oxide forms a network to develop conductivity, while magnesium oxide aggregates in the gaps of the network of zinc oxide to transmit ultraviolet rays.

The heat treatment temperature of the electrode layer is preferably 750° C. or more, more preferably 900° C. or more. The upper limit is not particularly limited, and may be, for example, 1200° C. or less.

In this embodiment, the conductivity of the electrode layer (at 25° C.) is preferably $1.0 \times 10^{-2}$ S/cm or more. When the conductivity is $1.0 \times 10^{-2}$ S/cm or more, for example, conductivity is sufficient and current injection efficiency is high when used as an electrode of a semiconductor device. The conductivity of the electrode layer is more preferably $1.0 \times 10^{-1}$ S/cm or more. The upper limit is not particularly limited, and may be, for example, 10000 S/cm or less.

The conductivity of the electrode layer is a measured value of a sample in which an electrode layer alone is formed on a glass substrate or the like which is an insulator. Conductivity can be measured, for example, with a Hall-effect measurement device.

The electrode layer essentially consists of magnesium oxide and zinc oxide, or preferably essentially consists of magnesium oxide, zinc oxide and oxide of the element X. For example, 90% by mass or more, 95% by mass or more, or 99% by mass or more of the electrode layer may be magnesium oxide and zinc oxide, or may be magnesium oxide, zinc oxide and oxide of the element X. Further, the electrode layer may consist of magnesium oxide and zinc oxide, or may consist of magnesium oxide, zinc oxide and oxide of the element X. In this case, an unavoidable impurity may be contained.

In one embodiment of the invention, it is preferable that diffraction peaks at $2\theta=34.8\pm0.5$ deg be observed in the X-ray diffraction measurement of the electrode layer. It is presumed that a change in the morphology of the electrode layer appears at the above-mentioned peaks (see Example 2, Comparative Example 3, and FIG. 5).

In one embodiment of the invention, a light transmittance of a wavelength of 260 nm of the electrode layer is preferably 4% or more, 5% or more, 6% or more, 7% or more, 8% or more, or 9% or more, and more preferably 10% or more. The upper limit is not particularly limited, and is, for example, 80% or less. In this embodiment, light having a wavelength of 260 nm, which is deep-ultraviolet, can also be sufficiently transmitted. The electrode (electrode layer) according to this embodiment having high light transmittance in the deep-ultraviolet region (region of 260 nm or less) (or transparency in the deep-ultraviolet region) and having good conductivity can be suitably used as an alternative to mercury lamps.

The light transmittance is measured by a spectrophotometer for a sample in which the electrode layer is formed to a thickness of 100 nm on a substrate having a high light transmittance of 260 nm, such as a sapphire substrate.

The thickness of the electrode layer can be appropriately adjusted to obtain the desired light transmittance and conductivity. For example, the thickness is preferably in the range of 1 nm to 10 μm, and more preferably in the range of 10 nm or more and 1 μm or less. The cross-sectional shape such as a thickness of the electrode layer, for example, can be confirmed by scanning electron microscopy (SEM) or transmission electron microscopy (TEM).

The electrode layer may be an amorphous layer or a polycrystalline layer as long as the regions where electrons flows are electrically connected to each other. Further, the electrode layer may be a layer in which an amorphous component and a crystalline component are mixed. The crystallinity of the electrode layer can be determined from the lattice image of TEM.

In particular, in order to improve conductivity and transmittance in the vertical direction, it is preferable that the electrode layer be composed of microcrystals and be phase-separated. The electrode layer preferably has a columnar crystal growth (the microcrystals are columnar). Such microcrystals may be, for example, microcrystals of a region mainly composed of magnesium oxide and a region mainly composed of zinc oxide. As shown in FIG. 10, in order to better realize ultraviolet transmittance, the particle size of the region mainly composed of magnesium oxide is preferably 20 nm or more. As a result, transmittance in the region of a wavelength of less than 300 nm is further improved. Further, it is preferable that the particle size of the region mainly composed of magnesium oxide is 200 nm or less. As a result, conductivity is further improved. The "particle size" herein is a value measured by the method described in Examples.

In one embodiment of the invention, the electrode layer has an absorption edge wavelength of less than 400 nm at 25° C. It is preferably 350 nm or less, more preferably 300 nm or less. Here, the absorption edge wavelength is a wavelength on the longest wavelength side where light transmittance is 1% in the ultraviolet region. When the absorption edge wavelength is 400 nm or more, when the electrode layer is used as an electrode of an ultraviolet light-emitting semiconductor device, ultraviolet rays emitted inside the device do not transmit through the electrode so that luminous efficiency of the device is lowered. The absorption edge wavelength can be measured by, for example, a spectrophotometer.

In one embodiment of the invention, a wiring layer may be formed in contact with a part of the electrode layer. The wiring layer assists the electrical conduction of the electrode layer and is useful in a semiconductor device that requires a high current.

In this embodiment, since the ultraviolet rays are taken out of the device through the electrode layer, it is preferable that the wiring layer be formed so as not to block the ultraviolet rays as much as possible. Specifically, the wiring layer may be formed in a linear shape (stripe shape) near the edge of the electrode layer, or may be formed on the electrode layer in a lattice shape having a large degree of opening. In any shape, it is preferable to make the width of the wiring layer as narrow as possible.

The wiring layer is preferably formed on the opposite surface in contact with the semiconductor layer of the electrode layer. In addition, it is preferable to form the electrode layer from a material having higher conductivity than the electrode layer. Examples include, for example, metals containing one or more selected from Ni, Pd, Pt, Rh, Zn, In, Sn, Ag, Au, Mo, Ti, Cu and Al (when two or more are selected, the metals may be alloys), oxides such as ITO and $SnO_2$, ZnO, $In_2O_3$, $Ga_2O_3$, $RhO_2$, NiO, CoO, PdO, PtO, $CuAlO_2$ and $CuGaO_2$, nitrides such as TiN, TaN and SiNx, and poly-Si (polysilicon).

When visible light is taken out along with ultraviolet rays through the electrode layer, it is preferable that the wiring layer be a transparent conductive oxide or a transparent conductive nitride having light transparency.

The wiring layer may be a single layer or a stack of two or more layers. For example, a layer containing Ni may be formed on the side in contact with the electrode layer, and an Au layer may be stacked on the Ni layer to prevent oxidation. Each layer constituting the wiring layer may contain at least one selected from the group consisting of the above-mentioned metals, oxides and nitrides.

The thickness of the wiring layer can be appropriately adjusted to obtain desired electrical characteristics. The thickness is preferably in the range of, for example, 10 nm to 10 μm.

The stacked body of this embodiment can be produced, for example, by forming an electrode layer containing magnesium oxide and zinc oxide on a semiconductor layer containing a group III-V nitride semiconductor.

In the above method for producing, a method for forming the semiconductor layer, the electrode layer, and the wiring layer is not particularly limited. For example, resistance wire heated deposition, electrons beam (EB) deposition, sputtering, atom layer deposition (ALD) film formation, thermochemical vapor deposition (thermal CVD), parallel plate plasma CVD, magnetic field microwave plasma CVD, inductively coupled plasma CVD, spin coating, and ion plating can be used.

In the case of film formation by sputtering, reactive sputtering of a metal target in an oxygen-containing atmosphere can also be suitably used. As a result, the film formation rate is improved as compared with the sputtering using an insulator target.

The films are formed by continuously controlling the composition by adjusting the respective film formation rate in co-sputtering with the magnesium oxide (MgOx) sintered target, the zinc oxide (ZnOx) sintered target, and optionally, the sintered target containing element X, by adjusting the deposition rate of each.

When the electrode layer is formed after the semiconductor layer is formed, from the viewpoint of reducing thermal damage to the semiconductor layer, the electrode layer is preferably formed by sputtering using at least one selected from $O_2$, Ar and $N_2$ as a sputtering gas, or ion plating.

The sintered body target containing magnesium oxide and zinc oxide, for example, can be produced by referring to WO2012/014688A1.

Similarly, the wiring layer is preferably formed by sputtering using at least one of $O_2$, Ar and $N_2$ as a sputtering gas, or evaporation.

In one embodiment, the method for producing preferably contains a step of heat-treating the electrode layer at a temperature of 750° C. or higher. As a result, it is possible to form a morphology that develops conductivity and ultraviolet transmittance in the electrode layer. The heat treatment temperature of the electrode layer is more preferably 900° C. or higher. The upper limit is about 1200° C.

The heat treatment time can be appropriately adjusted depending on the treatment temperature, the thickness of the electrode layer, and the like. The heat treatment time is usually 30 seconds to 1 hour.

The heat treatment is preferably carried out in an inert atmosphere such as a nitrogen atmosphere or a reducing atmosphere such as a hydrogen atmosphere.

In one embodiment of the invention, an electrode layer containing magnesium oxide and zinc oxide may be formed on a substrate having high ultraviolet transmittance such as a sapphire substrate, and a semiconductor layer containing a group III-V nitride semiconductor may be formed on the electrode layer after heat treatment of the electrode layer. Alternatively, a wiring layer may be formed on a substrate having high ultraviolet transmittance, then an electrode layer containing magnesium oxide and zinc oxide may be formed, and after the electrode layer is subjected to heat treatment, a semiconductor layer containing a group III-V nitride semiconductor may be formed on the electrode layer.

In this embodiment, the semiconductor layer is formed after the heat treatment of the electrode layer, thus reducing thermal damage to the semiconductor layer.

The stacked body of this embodiment can be used, for example, in members of a semiconductor device such as a short-wavelength light-emitting diode, a laser diode, or the like, which emits visible light and/or ultraviolet rays using a gallium nitride semiconductor.

Specific examples of the light-emitting diode will be described below with reference to the drawings as the semiconductor using the stacked body of this embodiment. The semiconductor device of the invention is not limited to the following examples.

Figure 1:
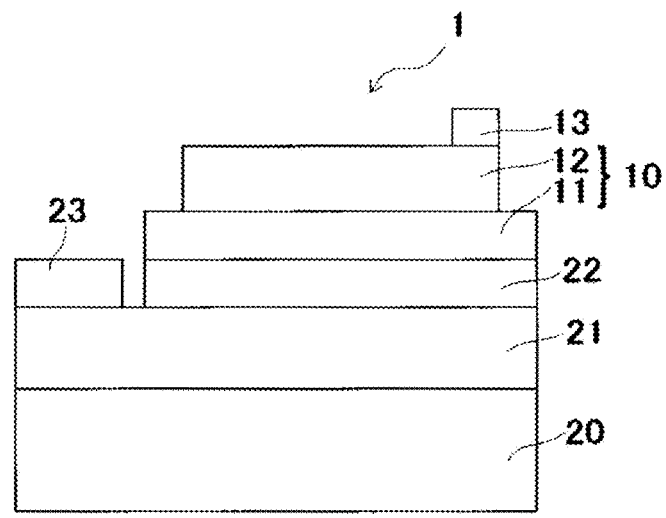
FIG. 1 is a schematic configuration diagram of a light-emitting diode (LED) according to one embodiment of the invention.

FIG. 1 is a schematic configuration diagram of a light-emitting diode according to one embodiment of the invention.

In the light-emitting diode 1, on substrate 20, an n-type GaN-based semiconductor layer 21 is stacked, an electrode layer 23 (cathode) is formed in a part of the vicinity of the edge on the semiconductor layer 21, and an emitting layer 22 is formed on the n-type GaN-based semiconductor layer 21 except on the electrode layer 23 and the vicinity thereof. The light-emitting diode 1 has the structure in which the stacked body 10 of the invention (semiconductor layer (p-type GaN-based semiconductor layer) 11, and the electrode layer 12) is formed on the emitting layer 22. Further, near the upper surface edge of the electrode layer 12, the wiring layer 13 is formed.

Figure 2:
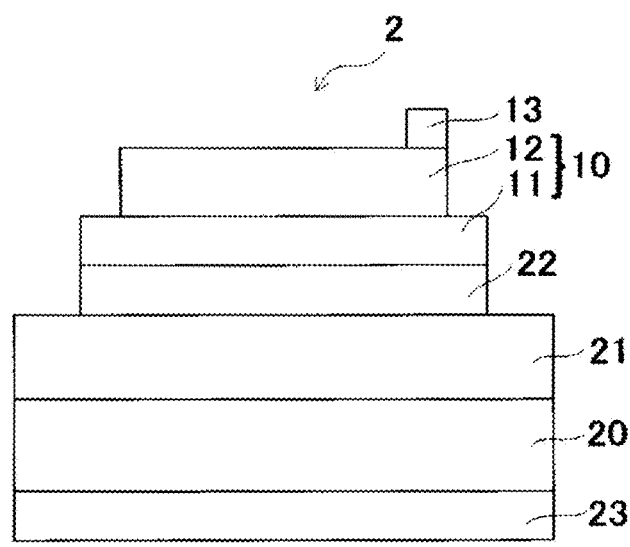
FIG. 2 is a schematic configuration diagram of a LED according to another embodiment of the invention.

FIG. 2 is a schematic configuration diagram of a light-emitting diode according to another embodiment of the invention.

The light-emitting diode 2 has the structure in which an electrode layer 23 (cathode), a substrate 20, an n-type GaN-based semiconductor layer 21, an emitting layer 22, the stacked body 10 (semiconductor layer (p-type GaN-based semiconductor layer) 11, and the electrode layer 12) of the invention is stacked in this order. Further, near one edge of the upper surface of the electrode layer 12, the wiring layer 13 is formed.

Figure 3:
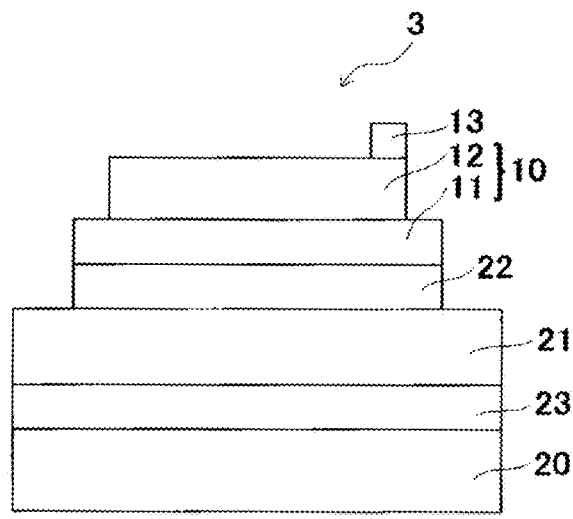
FIG. 3 is a schematic configuration diagram of an LED according to another embodiment of the invention.

FIG. 3 is a schematic configuration diagram of a light-emitting diode according to another embodiment of the invention.

The light-emitting diode 3 has the structure in which a substrate 20, an electrode layer 23 (cathode), an n-type GaN-based semiconductor layer 21, an emitting layer 22, the stacked body 10 (semiconductor layer (p-type GaN-based semiconductor layer) 11, and the electrode layer 12) of the invention is stacked in this order. Further, near the upper surface edge of the electrode layer 12, the wiring layer 13 is formed.

In the light-emitting diodes 1 to 3, when a voltage is applied between the electrode layer 12 and the electrode 23 via the wiring layer 13, holes are injected to the semiconductor layer 11, and electrons are injected to the n-type GaN-based semiconductor layer 21. The light is emitted when the injected holes and electrons recombine in the emitting layer 22.

In the light-emitting diodes 1 to 3, the wiring layer 13 is formed, and it may be omitted. In this case, a voltage is applied between the electrode layer 12 and the electrode layer 23 without using the wiring layer. Further, in the light-emitting diode 3 (FIG. 3), the stacked body of the invention may be adapted to the electrode layer 23 and the n-type GaN-based semiconductor layer 21.

The constituent members of each embodiment described above are not particularly limited, and known members can be used. Further, the constituent members can be produced by applying a known film forming technique.

According to the invention, a semiconductor device having an electrode layer having excellent current-voltage characteristics and high ultraviolet transmittance can be obtained.

EXAMPLES

Example 1

(1) Preparation of the Electrode Layer

Figure 4:
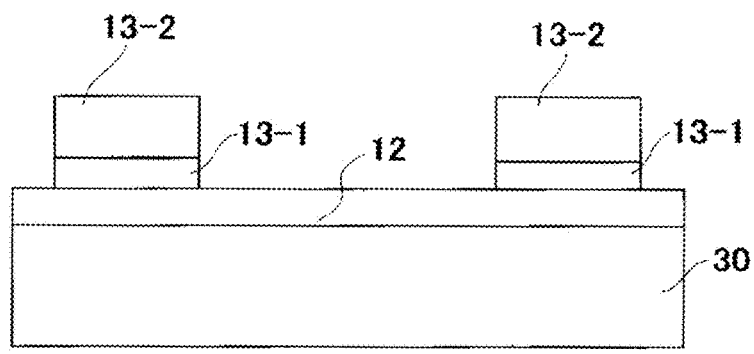
FIG. 4 is a schematic cross-sectional view of the evaluation sample prepared in Examples and Comparative Examples.

A schematic cross-sectional view of the evaluation sample prepared in Examples and Comparative Examples is shown in FIG. 4.

A sapphire substrate (0.5 mm thick), which is a support substrate 30, was placed in an ultrasonic cleaning vessel and washed with trichloroethylene for 5 minutes, acetone for 5 minutes, methanol for 5 minutes, and finally distilled water for 5 minutes.

Afterward, the support substrate 30 was set in the sputtering apparatus (manufactured by ULVAC: ACS-4000), magnesium oxide-zinc oxide sputtering target with a molar ratio of Mg [Mg/(Mg+Zn)] of 0.33 (manufactured by Furuuchi Chemical Corporation) was used to form an electrode layer 12 having the thickness of 100 nm on the support substrate 30 at 25° C. using Ar as the sputtering gases.

(2) Heat Treatment

The substrate having the electrode layer 12 prepared in (1) above was subjected to heat treatment (activation annealing) at 950° C. for 5 minutes in a nitrogen atmosphere.

(3) Formation of the Wiring Layer

After the heat treatment, the substrate was set in an EB deposition apparatus (manufactured by ULVAC) together with an area mask, and a Ni layer 13-1 (thickness: 20 nm) and an Au layer 13-2 (thickness: 200 nm) were formed to form a wiring layer having stacked structure.

For the resulting measurement sample, conductivity was measured using a resistivity/Hall measuring system (manufactured by TOYO Corporation: ResiTest8300). A spectrophotometer (manufactured by Shimadzu Corporation: UV-2600) was used to evaluate the absorption edge wavelength and light transmittance.

Evaluation results are shown in Table 1.

TABLE 1

| | Example 1 | Comp. Ex. 1 | Comp. Ex. 2 |
|---|---|---|---|
| Molar ratio of the target [Mg/(Mg + Zn)] | 0.33 | 0.33 | 0.33 |
| Heat treatment temperature (° C.) | 950 | Untreated | 700 |
| Conductivity (S/cm) | $3.26 \times 10^{-1}$ | $7.69 \times 10^{-6}$ | $1.41 \times 10^{-3}$ |
| Absorption edge wavelength | Less than 200 nm | Less than 200 nm | Less than 200 nm |
| Light transmittance ($\lambda$ = 260 nm: %) | 5.0 | 1.2 | 1.8 |

Comparative Example 1

Except that the heat treatment of Example 1(2) was not carried out, an evaluation sample was prepared and evaluated in the same manner as in Example 1. The results are shown in Table 1.

Comparative Example 2

Except that the heat treatment temperature of Example 1(2) was set to 700° C., an evaluation sample was prepared and evaluated in the same manner as in Example 1. The results are shown in Table 1.

Example 2

Except that magnesium oxide-zinc oxide sputtering target of Mg ratio [Mg/(Mg+Zn)] of 0.50 (manufactured by Furuuchi Chemical Corporation) was used in Example 1(1), an evaluation sample was prepared and evaluated in the same manner as in Example 1. The results are shown in Table 2.

TABLE 2

|  | Example 2 | Comp. Ex. 3 | Comp. Ex. 4 |
| --- | --- | --- | --- |
| Molar ratio of the target [Mg/(Mg + Zn)] | 0.50 | 0.50 | 0.50 |
| Heat treatment temperature (° C.) | 950 | Untreated | 700 |
| Conductivity (S/cm) | $1.60 \times 10^{-1}$ | $1.27 \times 10^{-7}$ | $2.55 \times 10^{-7}$ |
| Absorption edge wavelength | Less than 200 nm | Less than 200 nm | Less than 200 nm |
| Light transmittance ($\lambda$ = 260 nm: %) | 13.5 | 5.1 | 7.6 |

Comparative Example 3

Except that the heat treatment of Example 1(2) was not carried out, an evaluation sample was prepared and evaluated in the same manner as in Example 1. The results are shown in Table 2.

Comparative Example 4

Except that the heat treatment temperature of Example 1(2) was set to 700° C., an evaluation sample was prepared and evaluated in the same manner as in Example 1. The results are shown in Table 2.

The electrode layers of Example 2 and Comparative Example 3 were subjected to X-ray diffraction measurement. The measurement conditions are as follows.

Equipment: Ultima-III, manufactured by Rigaku Corporation

X-ray: Cu-K$\alpha$ ray (wavelength: 1.5406 Å, monochromatized by graphite monochromator)

Output:40 kV-40 mA 2e-e reflection method, continuous scan (1.0°/min)

Sampling interval: 0.02°

Slit DS, SS: ⅔°, RS: 0.6 mm

Figure 5:
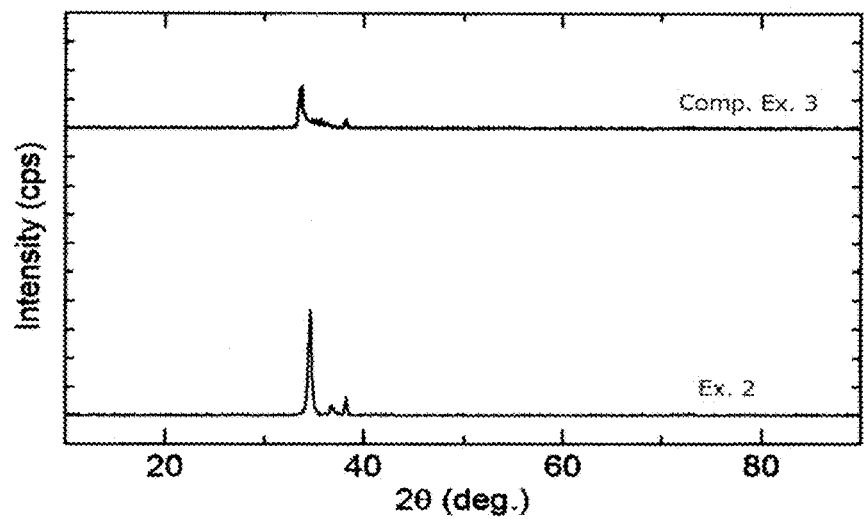
FIG. 5 is an X-ray diffraction pattern of the electrode layer of Example 2 and Comparative Example 3.

FIG. 5 is an X-ray diffraction pattern of the electrode layers of Example 2 and Comparative Example 3.

In Example 2, the strongest diffraction peak (2θ=34.8 deg) is a diffraction peak of zinc oxide (ZnO (002)).

Figure 6:
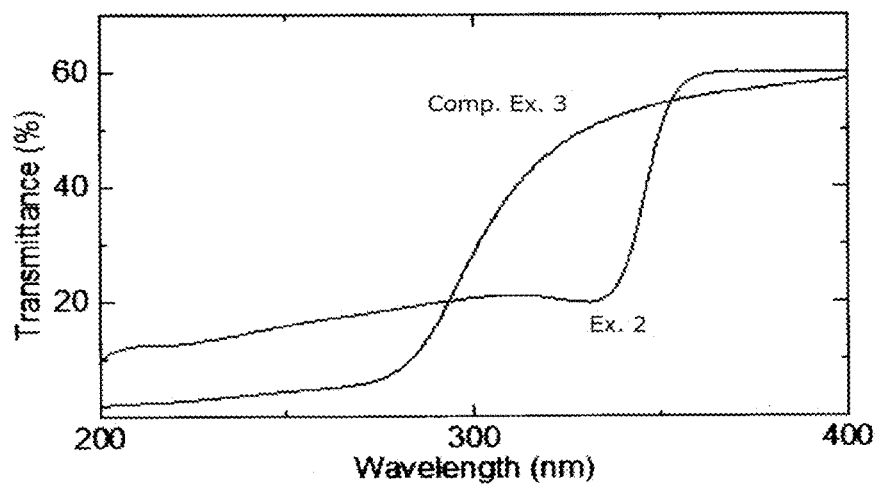
FIG. 6 is a light transmission spectrum of the electrode layer of Example 2 and Comparative Example 3.

FIG. 6 is a light transmission spectrum of the electrode layers of Example 2 and Comparative Example 3.

In Comparative Example 3 in which no heat treatment is performed, since zinc oxide which does not transmit ultraviolet rays is dispersed in the entire film, the transmittance gradually decreases to 0% from around 350 nm. On the other hand, in Example 2 heat-treated at a high temperature, the transmittance drops to about 20% at around 350 nm, and the degree of decrease in transmittance is small to around 350 to 200 nm. This is considered to be because, by heat treatment, a region mainly composed of zinc oxide (absorption edge wavelength: 358 nm) and a region mainly composed of magnesium oxide (absorption edge wavelength: 159 nm) are separated, and a certain amount of ultraviolet rays are transmitted from a region mainly composed of magnesium oxide.

Figure 7:
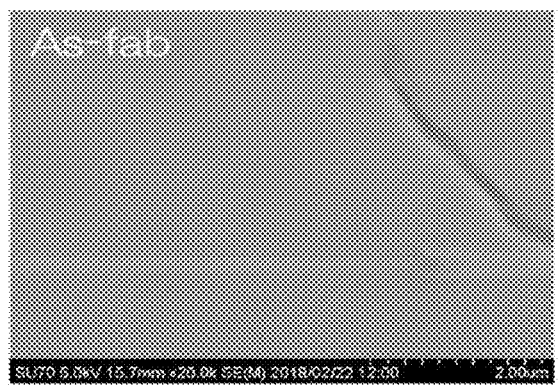
FIG. 7 is scanning electron microscopy (SEM) images of the upper surface of the electrode layer, (a) is an SEM image of Comparative Example 3, (b) is an SEM image of Example 2.
Figure 7:
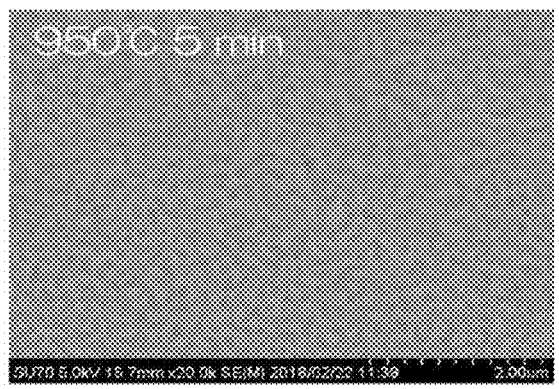

FIG. 7 is scanning electron microscopy (SEM) images of the upper surface of the electrode layer, (a) is an SEM image of Comparative Example 3, (b) is an SEM image of Example 2.

Figure 8:
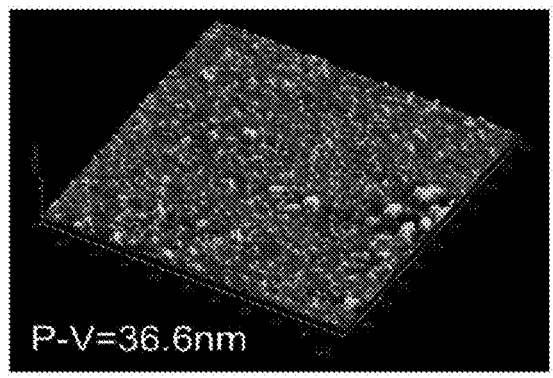
FIG. 8 is atom force microscopy (AFM) images of the upper surface of the electrode layer, (a) is an AFM image of Comparative Example 3, and (b) is an AFM image of Example 2.
Figure 8:
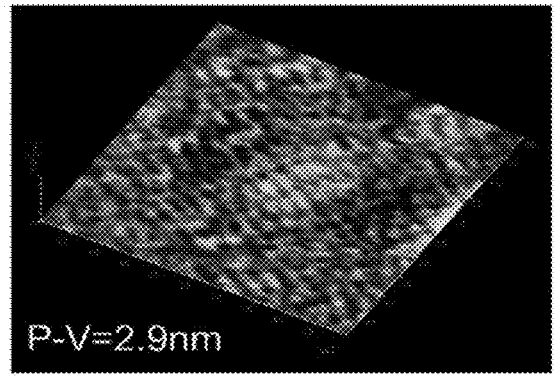

FIG. 8 is atom force microscopy (AFM) images of the upper surface of the electrode layer, (a) is an AFM image of Comparative Example 3, and (b) is an AFM image of Example 2.

In Comparative Example 3 (FIG. 7(a) and FIG. 8(a)), the surface shape in the SEM image was smooth. On the other hand, in Example 2 (FIG. 7(b) and FIG. 8(b)), light and dark were observed in the SEM image, and phase separation was observed. Further, from the results of XRD (FIG. 5), the peak of the ZnO phase (0002) around 340 and the peak of the MgO phase (111) around 370 are observed, respectively, and they are considered to correspond to the SEM image. It is considered that, while the zinc oxide phase exhibits conductivity, the magnesium oxide phase is responsible for ultraviolet transmittance, so that both conductivity and ultraviolet transmittance are compatible.

Figure 9:
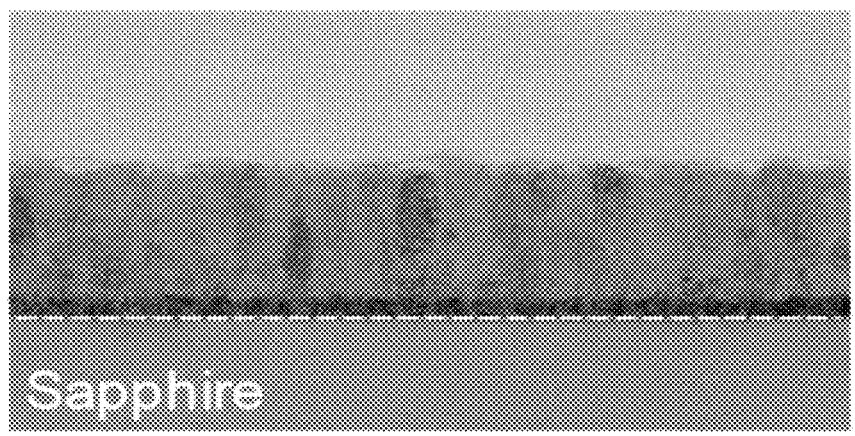
FIG. 9 is transmission electron microscopy (TEM) images of the cross-section of the electrode layer, (a) is a TEM Image of Example 2, and (b) is a TEM image of Comparative Example 3.
Figure 9:
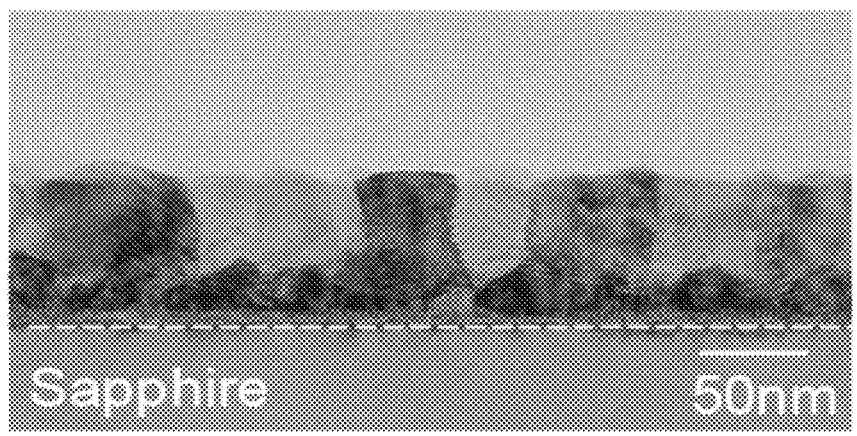

FIG. 9 is transmission electron microscopy (TEM) images of the cross-section of the electrode layer, (a) is a TEM Image of Example 2, and (b) is a TEM image of Comparative Example 3.

FIG. 10 is a TEM image and an energy dispersive X-ray analysis (EDX) image of the cross-section of the electrode layer of Example 2.

From FIG. 10, it can be seen that the electrode layer is composed of microcrystals and is phase-separated. Further, it can be seen that the electrode layer has a columnar crystal growth. Furthermore, in the electrode layer, it can be seen that a region mainly composed of zinc oxide (ZnO, etc.) and a region mainly composed of magnesium oxide (MgO, etc.) are in a state of being dispersed, respectively. The particle size of the region mainly composed of magnesium oxide was 70 nm. Note that the particle size of the region mainly composed of magnesium oxide is a value measured by TEM. Specifically, 10 arbitrary vertical cross-sections are selected within a radius of 10 μm from the center of the stacked body. For each location, an area of 400 nm in width was observed at a magnification of 500,000 times, and a straight line was drawn at the center of the electrode layer. The distance between each intersection point of the line and the particle boundary is measured and averaged. Further, the average of the entire 10 fields of view is taken, and the value is defined as "particle size of the region mainly composed of magnesium oxide".

Example 3

Except that magnesium oxide-zinc oxide sputtering target of Mg ratio [Mg/(Mg+Zn)] of 0.70 (manufactured by Furuuchi Chemical Corporation) was used in Example 1(1), an evaluation sample was prepared and evaluated in the same manner as in Example 1. Results are shown in Table 3.

TABLE 3

|  | Example 3 | Comp. Ex. 5 | Comp. Ex. 6 |
| --- | --- | --- | --- |
| Molar ratio of the target [Mg/(Mg + Zn)] | 0.70 | 0.80 | 0.90 |
| Heat treatment temperature (° C.) | 950 | 950 | 950 |
| Conductivity (S/cm) | $1.10 \times 10^{-1}$ | $2.10 \times 10^{-7}$ | $8.91 \times 10^{-7}$ |
| Absorption edge wavelength | Less than 200 nm | Less than 200 nm | Less than 200 nm |
| Light transmittance ($\lambda$ = 260 nm: %) | 18.0 | 52.7 | 53.1 |

Comparative Example 5

Except that magnesium oxide-zinc oxide sputtering target of Mg ratio [Mg/(Mg+Zn)] of 0.80 (manufactured by Furuuchi Chemical Corporation) was used in Example 1(1), an evaluation sample was prepared and evaluated in the same manner as in Example 1. Results are shown in Table 3.

Comparative Example 6

Except that magnesium oxide-zinc oxide sputtering target of Mg ratio [Mg/(Mg+Zn)] of 0.90 (manufactured by Furuuchi Chemical Corporation) was used in Example 1(1), an evaluation sample was prepared and evaluated in the same manner as in Example 1. Results are shown in Table 3.

Example 4

A stacked body was produced and evaluated in the same manner as in Example 1 except that Al was added to the electrode layer 12 as the element X. Regarding the electrode layer 12, the support substrate 30 was set in the sputtering apparatus. Magnesium oxides-zinc oxide sputtering target doped with Al in which a molar ratio of Mg [Mg/(Mg+Zn)] was 0.54 and a molar ratio of Al [Al/(Mg+Zn+Al)] was 0.007 (manufactured by Furuuchi Chemical Corporation) was used to form an electrode layer 12 having the thickness of 100 nm on the support substrate 30 at 25° C. using Ar as the sputtering gases.

Evaluation results are shown in Table 4.

Example 5

An evaluation sample was produced and evaluated in the same manner as in Example 4 except that the molar ratio of Al [Al/(Mg+Zn+Al)] was adjusted to 0.00005 in Example 4. The results are shown in Table 4.

Example 6

An evaluation sample was produced and evaluated in the same manner as in Example 4 except that the molar ratio of Al [Al/(Mg+Zn+Al)] was adjusted to 0.0001 in Example 4. The results are shown in Table 4.

Example 7

An evaluation sample was produced and evaluated in the same manner as in Example 4 except that the molar ratio of Al [Al/(Mg+Zn+Al)] was adjusted to 0.018 in Example 4. The results are shown in Table 4.

Example 8

An evaluation sample was produced and evaluated in the same manner as in Example 4 except that the molar ratio of Al [Al/(Mg+Zn+Al)] was adjusted to 0.25 in Example 4. The results are shown in Table 4.

Example 9

An evaluation sample was produced and evaluated in the same manner as in Example 4 except that Ga was doped as the element X in place of Al and the molar ratio of Ga [Ga/(Mg+Zn+Ga)] was adjusted to 0.01 in Example 4. The results are shown in Table 4.

TABLE 4

|  | Example 4 | Example 5 | Example 6 | Example 7 | Example 8 | Example 9 |
| --- | --- | --- | --- | --- | --- | --- |
| Molar ratio of the target [Mg/(Mg + Zn)] | 0.54 | 0.54 | 0.54 | 0.54 | 0.54 | 0.54 |
| Element other than Mg and Zn (element X) | Al | Al | Al | Al | Al | Ga |
| Molar ratio of the target (Al or Ga) [Al/(Mg + Zn + Al)] or [Ga/(Mg + Zn + Ga)] | 0.007 | 0.00005 | 0.0001 | 0.18 | 0.25 | 0.01 |
| Heat treatment temperature (° C.) | 950 | 950 | 950 | 950 | 950 | 950 |
| Conductivity (S/cm) | $1.00 \times 10^3$ | $1.05 \times 10^{-1}$ | $0.90 \times 10^1$ | $6.90 \times 10^2$ | $5.20 \times 10^{-2}$ | $7.10 \times 10^2$ |
| Absorption edge wavelength | Less than 200 nm | Less than 200 nm | Less than 200 nm | Less than 200 nm | Less than 200 nm | Less than 200 nm |
| Light transmittance ($\lambda$ = 260 nm: %) | 16.0 | 16.0 | 16.0 | 16.3 | 16.8 | 14.1 |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A stacked body, comprising:
a semiconductor layer comprising a group III-V nitride semiconductor; and
an electrode layer comprising magnesium oxide and zinc oxide,
wherein the electrode layer has regions mainly composed of zinc oxide and regions mainly composed of magnesium oxide,
wherein the electrode layer has a molar ratio of magnesium based on a sum of magnesium and zinc, Mg/(Mg+Zn), in a range of from 0.25 to 0.75, and the electrode layer has a conductivity of $1.0 \times 10^{-2}$ S/cm or more.

2. The stacked body according to claim 1, wherein the molar ratio of magnesium based on the sum of magnesium and zinc of the electrode layer, Mg/(Mg+Zn), (Mg+Zn), is in a range of 0.4 to 0.75.

3. The stacked body according to claim 1, wherein the molar ratio of magnesium based on the sum of magnesium and zinc of the electrode layer, Mg/(Mg+Zn), is in a range of 0.5 to 0.75.

4. The stacked body according to claim 1, wherein the electrode layer further comprises trivalent or tetravalent element X other than Mg and Zn, and the electrode layer has a molar ratio of the trivalent or tetravalent element X based on total metal elements in a range of 0.0001 to 0.20.

5. The stacked body according to claim 4, wherein the trivalent or tetravalent element X is at least one element selected from the group consisting of B, Al, Ga, In, Tl, C, Si, Ge, Sn and Pb.

6. The stacked body according to claim 1, wherein in an X-ray diffraction measurement of the electrode layer, a diffraction peak is observed at $2\theta=34.8\pm0.5$ deg.

7. The stacked body according claim 1, wherein the electrode layer has a light transmittance of 4% or more at a wavelength of 260 nm.

8. The stacked body according to claim 1, wherein the electrode layer comprises microcrystals and is phase-separated.

9. The stacked body according to claim 1, wherein the electrode layer has a columnar crystal growth.

10. The stacked body according to claim 1, wherein a particle size of a region mainly of magnesium oxide of the electrode layer is from 20 nm to 200 nm.

11. The stacked body according to claim 1, wherein the semiconductor layer comprises AlN, GaN, InN, or a mixed crystal thereof.

12. The stacked body according to claim 1, further comprising:
a wiring layer in contact with a part of the electrode layer,
wherein the wiring layer comprises at least one selected from the group consisting of metals comprising one or more selected from Ni, Pd, Pt, Rh, Zn, In, Sn, Ag, Au, Mo, Ti, Cu and Al, oxides selected from ITO, $SnO_2$, ZnO, $In_2O_3$, $Ga_2O_3$, $RhO_2$, NiO, CoO, PdO, PtO, $CuAlO_2$ and $CuGaO_2$, nitrides selected from TiN, TaN and SiNx, and poly-Si.

13. The stacked body according to claim 1, wherein the electrode layer has a thickness of from 10 nm to 1 μm.

14. A semiconductor device, comprising the stacked body according to claim 1.

15. A method, comprising:
producing the stacked body according to claim 1,
wherein the electrode layer comprising magnesium oxide and zinc oxide is formed on the semiconductor layer comprising the group III-V nitride semiconductor.

16. The method according to claim 15, further comprising:
heat-treating the electrode layer at a temperature of 750° C. or higher.

17. The method according to claim 15, further comprising:
forming a wiring layer in contact with a part of the electrode layer,
wherein the wiring layer comprises at least one selected from the group consisting of metals comprising one or more selected from Ni, Pd, Pt, Rh, Zn, In, Sn, Ag, Au, Mo, Ti, Cu and Al, oxides selected from ITO, $SnO_2$, ZnO, $In_2O_3$, $Ga_2O_3$, $RhO_2$, NiO, CoO, PdO, PtO, $CuAlO_2$ and $CuGaO_2$, nitrides selected from TiN, TaN and SiNx, and poly-Si.

18. The method according to claim 17, further comprising:
forming the wiring layer by sputtering using at least one selected from $O_2$, Ar and $N_2$ as a sputtering gas, or evaporation.

19. The method according to claim 15, further comprising:
forming the electrode layer by sputtering using at least one selected from $O_2$, Ar and $N_2$ as a sputtering gas, or ion plating.

* * * * *